United States Patent
Pollard

(10) Patent No.: US 12,021,505 B2
(45) Date of Patent: Jun. 25, 2024

(54) HIGH Q BAW RESONATOR WITH SPURIOUS MODE SUPPRESSION

(71) Applicant: RF360 SINGAPORE PTE. LTD, Singapore (SG)

(72) Inventor: Thomas Bain Pollard, Longwood, FL (US)

(73) Assignee: RF360 Singapore Pte. Ltd., Singapore (SG)

( * ) Notice: Subject to any disclaimer, the term of this patent is extended or adjusted under 35 U.S.C. 154(b) by 561 days.

(21) Appl. No.: 17/256,985

(22) PCT Filed: May 28, 2019

(86) PCT No.: PCT/EP2019/063834
§ 371 (c)(1),
(2) Date: Dec. 29, 2020

(87) PCT Pub. No.: WO2020/015904
PCT Pub. Date: Jan. 23, 2020

(65) Prior Publication Data
US 2021/0143792 A1    May 13, 2021

(30) Foreign Application Priority Data
Jul. 17, 2018 (DE) .......................... 102018117248.6

(51) Int. Cl.
*H03H 9/17* (2006.01)
*H03H 9/02* (2006.01)
(Continued)

(52) U.S. Cl.
CPC ........ *H03H 9/175* (2013.01); *H03H 9/02015* (2013.01); *H03H 9/02157* (2013.01);
(Continued)

(58) Field of Classification Search
CPC ............... H03H 9/175; H03H 9/02015; H03H 9/02157; H03H 9/131; H03H 9/173;
(Continued)

(56) References Cited

U.S. PATENT DOCUMENTS 8,456,257 B1    6/2013  Fattinger
2012/0161902 A1 6/2012  Feng et al.
(Continued)

OTHER PUBLICATIONS

International Search Report and Written Opinion—PCT/EP2019/063834—ISA/EPO—dated Aug. 20, 2019.

*Primary Examiner* — Andrea Lindgren Baltzell
*Assistant Examiner* — Kimberly E Glenn
(74) *Attorney, Agent, or Firm* — Polsinelli

(57) ABSTRACT

A BAW resonator is provided wherein the top electrode (TE) has an outer flap (OF). The flap extends away from the active resonator region (AR) and has a projecting section that runs at a level above the piezoelectric layer (PL) that is higher than the level of the top electrode at any of the inwardly located areas enclosed by the outer flap. The higher level is formed by an intermediate step-forming material (SM) arranged between piezoelectric layer and top electrode in the outer flap. The step forming material comprises a structured layer of an acoustic impedance that is low w.r.t. the impedance of the top electrode and the piezoelectric layer.

17 Claims, 4 Drawing Sheets

Figure 1:
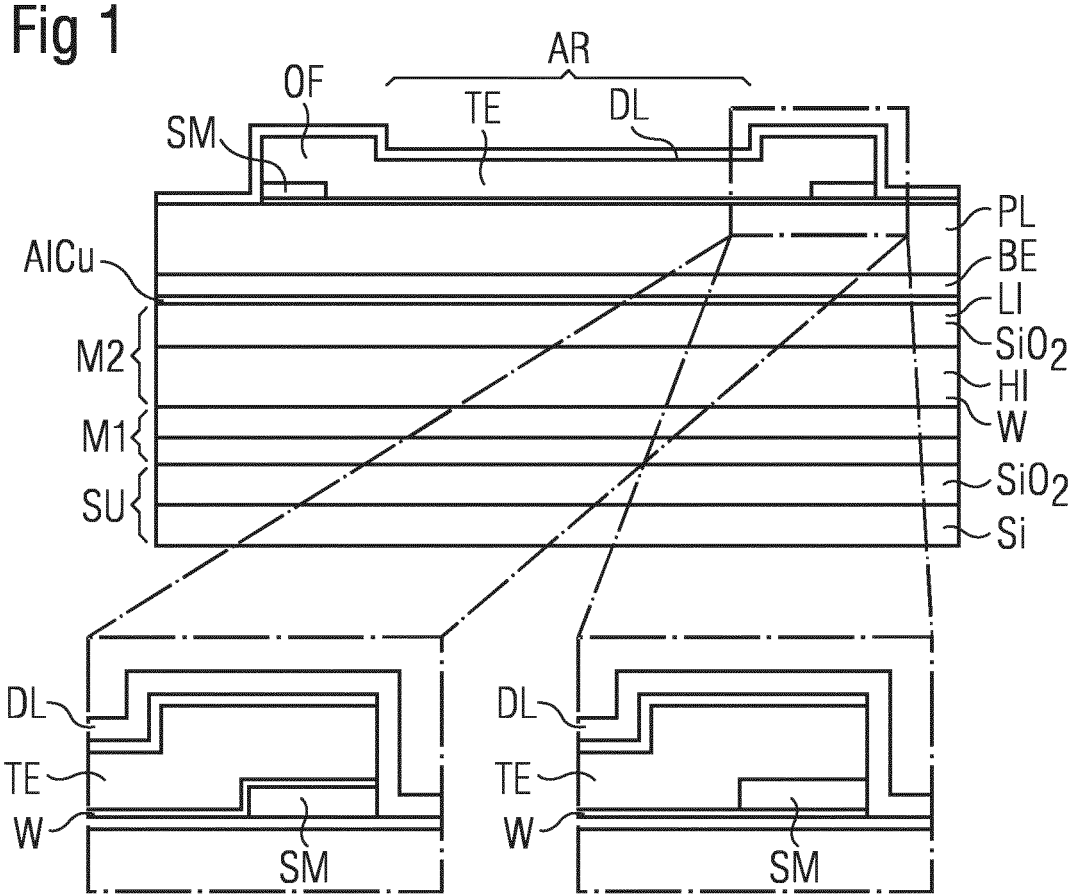

(51) Int. Cl.
　　　*H03H 9/13*　　　　(2006.01)
　　　*H03H 9/56*　　　　(2006.01)
(52) U.S. Cl.
　　　CPC ............ *H03H 9/131* (2013.01); *H03H 9/173* (2013.01); *H03H 9/568* (2013.01)
(58) Field of Classification Search
　　　CPC .. H03H 9/568; H03H 9/0211; H03H 9/02118; H03H 9/132
　　　See application file for complete search history.

(56) References Cited

U.S. PATENT DOCUMENTS

| | | |
|---|---|---|
| 2012/0206015 A1 | 8/2012 | Choy et al. |
| 2014/0354115 A1 | 12/2014 | Burak et al. |
| 2015/0094000 A1* | 4/2015 | Aigner .................. H03H 9/175 |
| | | 29/25.35 |
| 2016/0118958 A1 | 4/2016 | Burak et al. |
| 2016/0126930 A1 | 5/2016 | Zou et al. |
| 2017/0054430 A1 | 2/2017 | Fattinger et al. |
| 2017/0214387 A1* | 7/2017 | Burak ................ H03H 9/02118 |
| 2017/0288121 A1 | 10/2017 | Burak et al. |

\* cited by examiner

HIGH Q BAW RESONATOR WITH SPURIOUS MODE SUPPRESSION

BAW resonators in practice are finite in size along their lateral dimensions and have termination regions of one of the following three types: (i) no interconnect; (ii) top electrode interconnect, or (iii) bottom electrode interconnect. The top and bottom interconnects are used to electrically connect the resonator to other elements in the circuit—e.g. to other resonators arranged in a ladder configuration in frequency filtering applications. For case (i) the region is typically formed by terminating the top electrode or by terminating both the top and bottom electrode at approximately the same location. For cases (ii) and (iii) the region is formed by terminating the bottom and top electrodes, respectively.

The terminations in the resonator can be the source of spurious mode excitation as the localized internal lateral forces acting back on the materials under compression or extension are not canceled like they are near the center of the resonator. This can cause lateral modes to propagate back towards the resonator interior. In addition, this region can directly excite modes that propagate away from the resonator, resulting in lower resonator quality factor. Proper optimization of the termination geometry can reduce the spurious mode excitation and coupling and also help to contain more energy within the resonators. This improves the overall filter performance in and out of band (e.g. out of band performance is important in multiplexing applications).

It is an object of the invention to provide a BAW resonator that has a further increased quality factor Q and at the same time an improved suppression of spurious modes. A further object is to provide novel resonator termination geometries that improve the overall resonator performance.

This and other objects are met by a BAW resonator according to claim 1. Further improvements and preferred embodiments are provided by dependent claims.

A BAW resonator has a layer sequence comprising from bottom to top a substrate, a bottom electrode, a piezoelectric layer and a top electrode. The area where all the three layers bottom electrode, piezoelectric layer and top electrode layer overlap each other is the acoustically active resonator region. A special feature of the BAW resonator is provided at the top electrode that forms an outer flap at the margin of the active region. The flap extends away from the active resonator region and has a projecting section that runs at a level above the piezoelectric layer that is higher than the level of the top electrode at any of the inwardly located areas enclosed by the outer flap. The higher level is formed by an intermediate step-forming material arranged between piezoelectric layer and outer flap. The step forming material comprises a structured layer of a material having an acoustic impedance that is low w.r.t. the acoustic impedance of the top electrode and the piezoelectric layer.

Examples of such low impedance materials are $SiO_2$, Al, Ti, Mg, etc. The low impedance material may be dielectric because it need not contribute to the electrode properties but only influence acoustic modes. However, the material can also be an electrically conducting material. Suitable materials can be chosen according to their acoustic properties that can be taken from tables known in the art.

According to an embodiment the margin of the active resonator region comprises a so-called overlap region in which the thickness of the top electrode is higher than in the the active resonator region. The enhanced thickness is achieved by interposing a structure of an additional material selected from a heavy metal or other high acoustic impedance material like molybdenium and tungsten between top electrode and piezoelectric layer in the margin of the active resonator region.

The vertical layer structure of the resonator in the overlap region preferably extends to the end of the outer flap. Only the low impedance step forming material is additionally arranged—preferably between the piezoelectric layer and the top electrode.

The novel resonator has an improved performance. An approach for mode suppression and Q enhancement is given. With the invention, improved Q of ~1800-3000 around 2 GHz is expected based on proven simulation tools. Further, spurious modes can be compensated and rendered harmless. Spurious signals at the resonators' electrodes are minimized. Especially lateral modes that normally can arise in a margin area can be reduced by the outer flap.

In this invention with optimized thickness of the additional W and $SiO_2$ in the overlap and flap regions, respectively, and with optimized lateral dimensions the two features work together to create a lateral boundary condition that enhances the overlap Q-factor of the resonator that is better than that achieved with only an overlap structure.

The invention can be used at BAW resonators of different construction type. A SMR (solidly mounted resonator) type BAW resonator is mounted with intimate contact to the substrate. To keep the acoustic energy within the resonator, a Bragg mirror is arranged between substrate surface and bottom electrode. Such an acoustic mirror can comprise alternating layers of high and low acoustic impedance. The greater the impedance difference the better the reflection coefficient or the lower the required number of mirror layers.

Moreover, the invention can be used at an FBAR (thin film acoustic resonator) which needs an air-filled cavity directly below the active resonator region. The cavity can be formed as a recess in the substrate that is covered by a membrane or by one or more suspended resonator layers (e.g. electrode layer).

The outer flap can extend along the whole perimeter of the active resonator region thereby surrounding the active region. The shape of the outer flap can be the same along the whole perimeter when the BAW resonator is a stand-alone resonator or when the resonator has a bottom electrode interconnect or termination.

A dielectric layer comprising at least a SiN layer can cover the top electrode.

As an optional further advantageous detail an underlap is formed at a margin of the active resonator region extending along the whole perimeter between the active resonator region and the outer flap. The underlap is a region where a total thickness of top electrode and dielectric layer is smaller than a respective total thickness of the layer sequence in the center of the active resonator region.

This feature is useful to reduce spurious mode coupling at frequencies below the device's fundamental resonance (for a type II stack—not useful for a type I stack) when properly dimensioned.

In the underlap the smaller total thickness can achieved by a reduced thickness of the top dielectric layer.

Alternatively the smaller total thickness in the underlap can be achieved by enhancing the height exclusively in the active region by an additional layer that covers the top electrode in the active resonator region but not in the underlap region. This additional layer may be a dielectric layer or an electrically conducting layer preferably an additional layer of SiN. The additional layer should not be too dense to not enhance the sensitivity of the resonator properties on the thickness thereof and to avoid that too much acoustic energy is drawn into higher loss material of the top electrode which would otherwise reduce the Q factor of the resonator.

As a further alternative the smaller total thickness in the underlap can be achieved by a reducing the thickness of the top electrode in the underlap region.

As a further optional feature the margin of the active resonator region comprises an overlap region outwardly adjacent to the underlap in which the thickness of the top electrode is higher than in the underlap and in the active resonator region. Hence, the overlap region is arranged between underlap and outer flap.

In the overlap region a second step forming material can be arranged between top electrode and piezoelectric layer. Preferably, the second step forming material comprises a material of relatively high acoustic impedance. A suitable material can comprise at least one of W, Pt, Mo, and Ta as well as alloys thereof. However, a dielectric like $SiO_2$ can be used too for forming the overlap.

In an embodiment the top electrode includes a bottom layer comprising at least one of W, Pt, Mo, and Ta and a top layer comprising AlCu. It is now possible to arrange the first step forming material at outer flap between bottom layer and top layer of the top electrode.

Alternatively the step forming material can be arranged under the outer flap between the piezoelectric layer and the bottom layer of the top electrode.

According to an embodiment the thickness of the bottom layer of the top electrode is higher in the overlap region than the thickness thereof in the underlap and in the active resonator region.

Preferably the thickness of the top electrode layer and its sub-layers is the same at the overlap and at the outer flap.

The material of the piezoelectric layer may comprise AlN or ZnO. But is possible to dope the AlN e.g. with Sc (AlScN) to increase thepiezoelectric coupling. In practice, the amount of Sc in AlScN can be set between 1 and 40 mol %.

In the following the invention will be explained in more detail with reference to specific embodiments and the accompanying figures. The figures are schematically only and are not drawn to scale. For better understanding some detail may be depicted in enlarged form.

Figure 2:
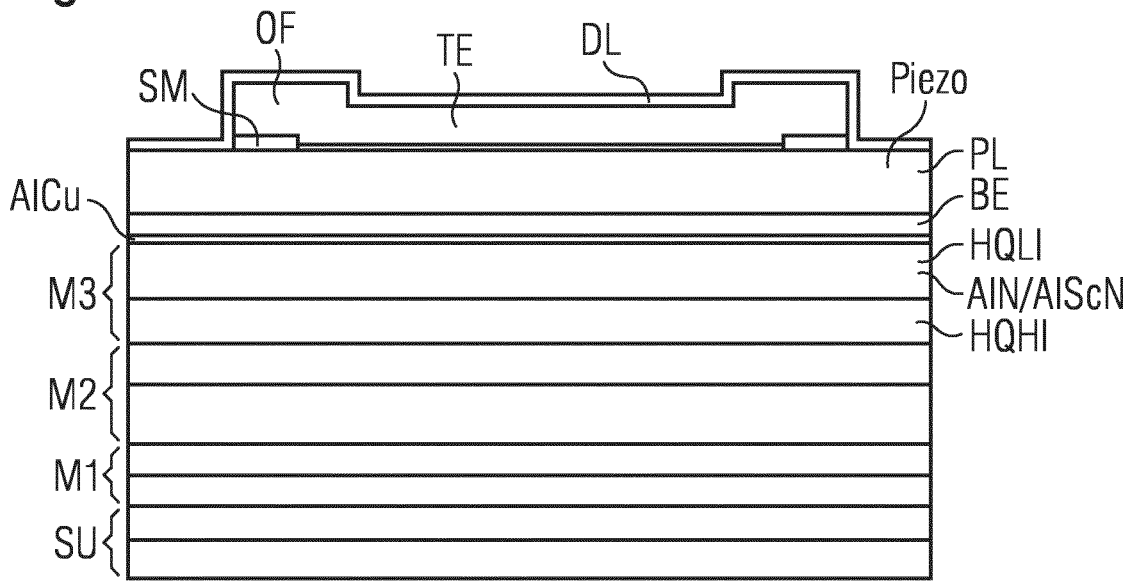
Figure 3:
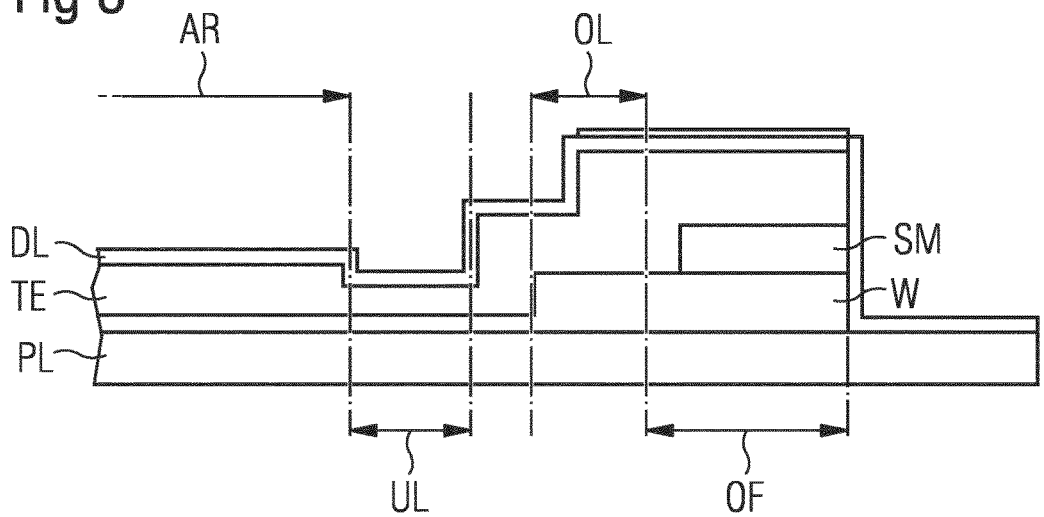
Figure 4:
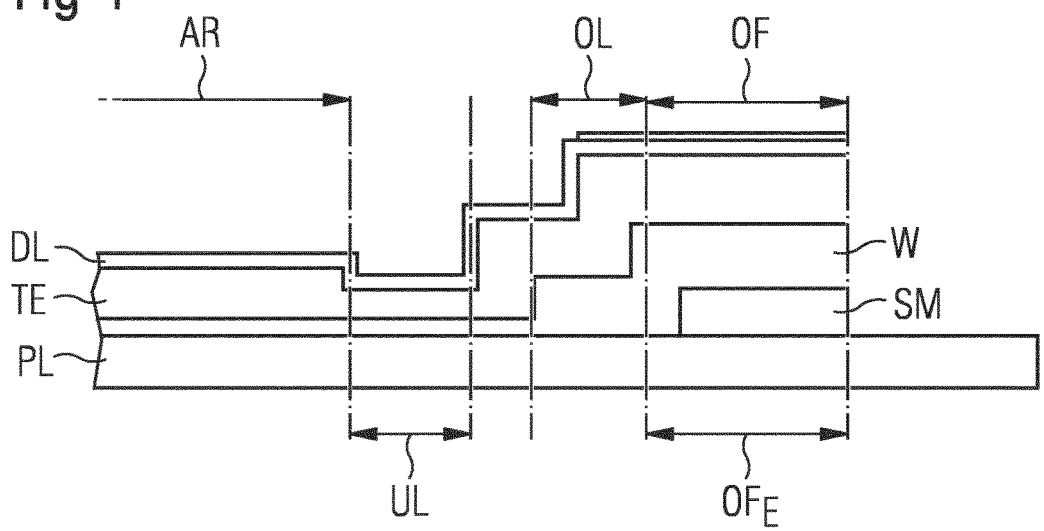
Figure 5:
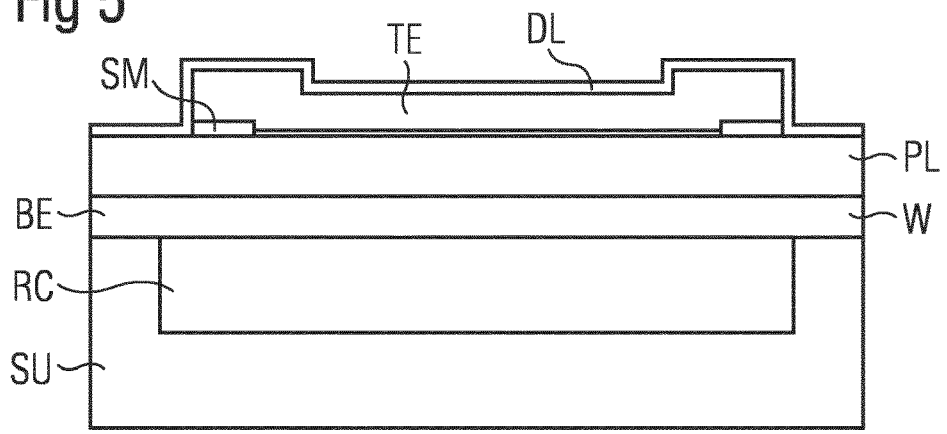
Figure 6:
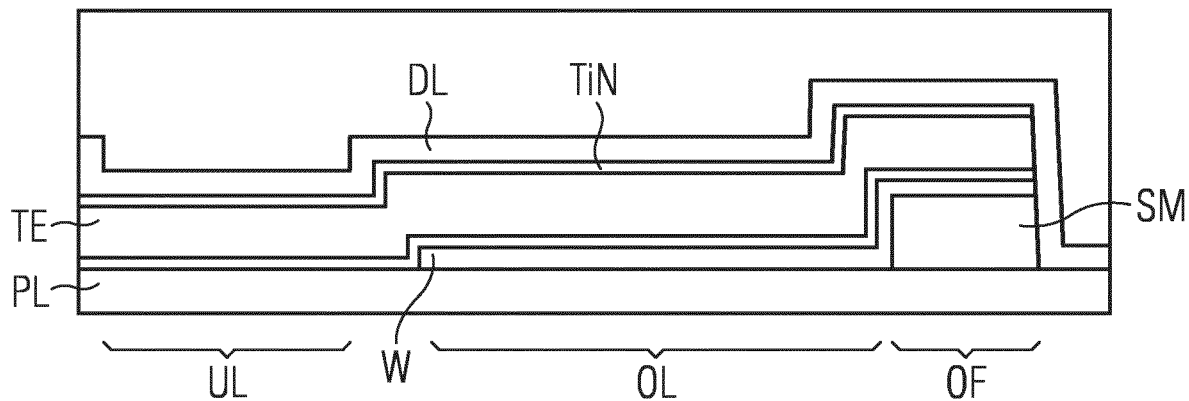
Figure 7:
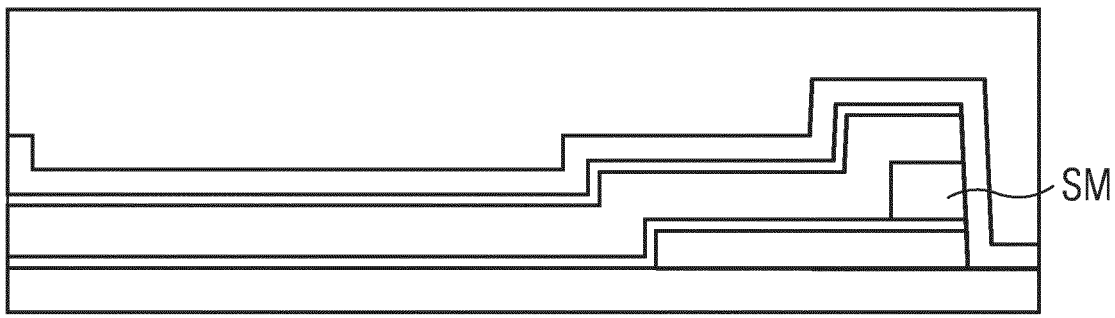
Figure 8:
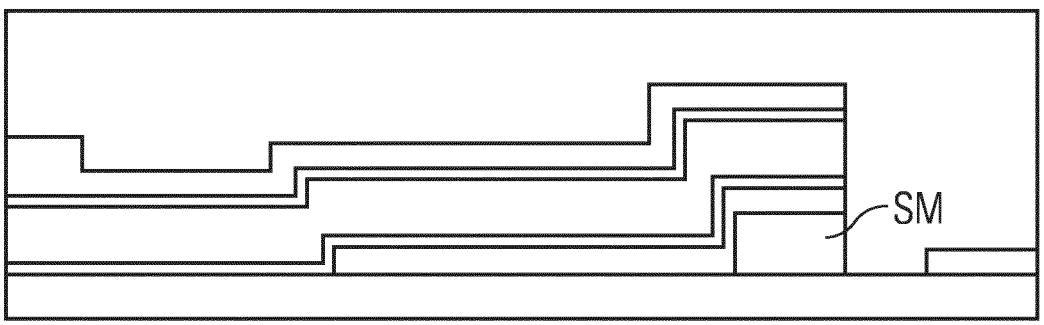
Figure 9:
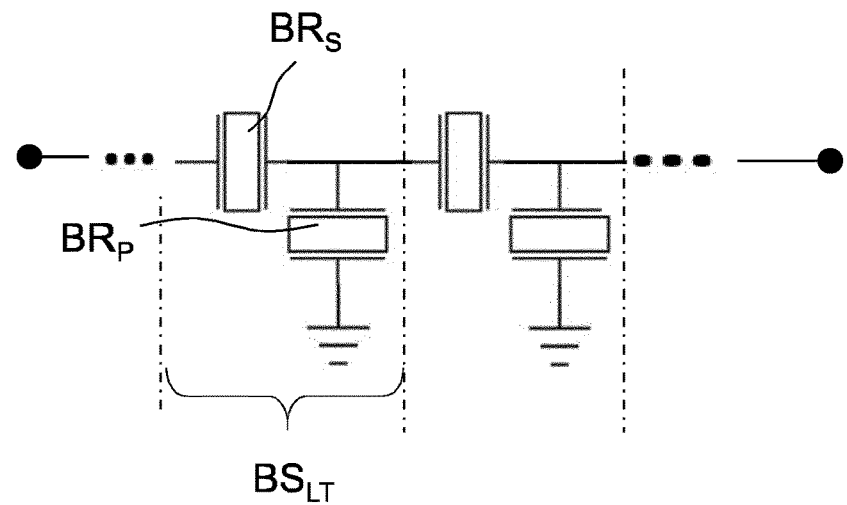
Figure 10:
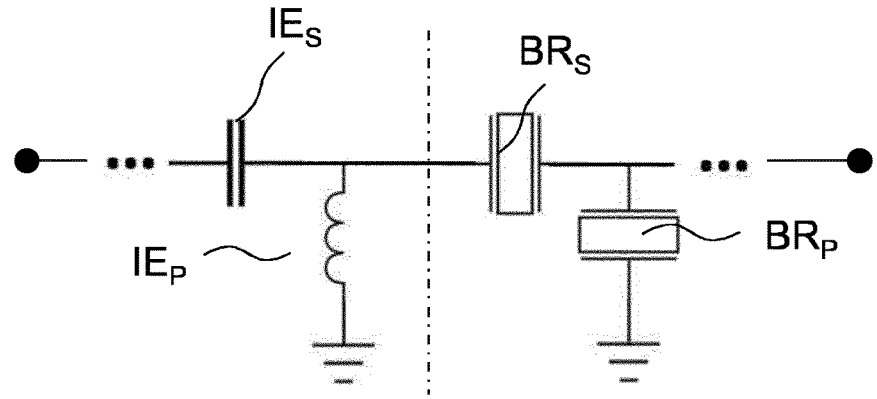
Figure 11:
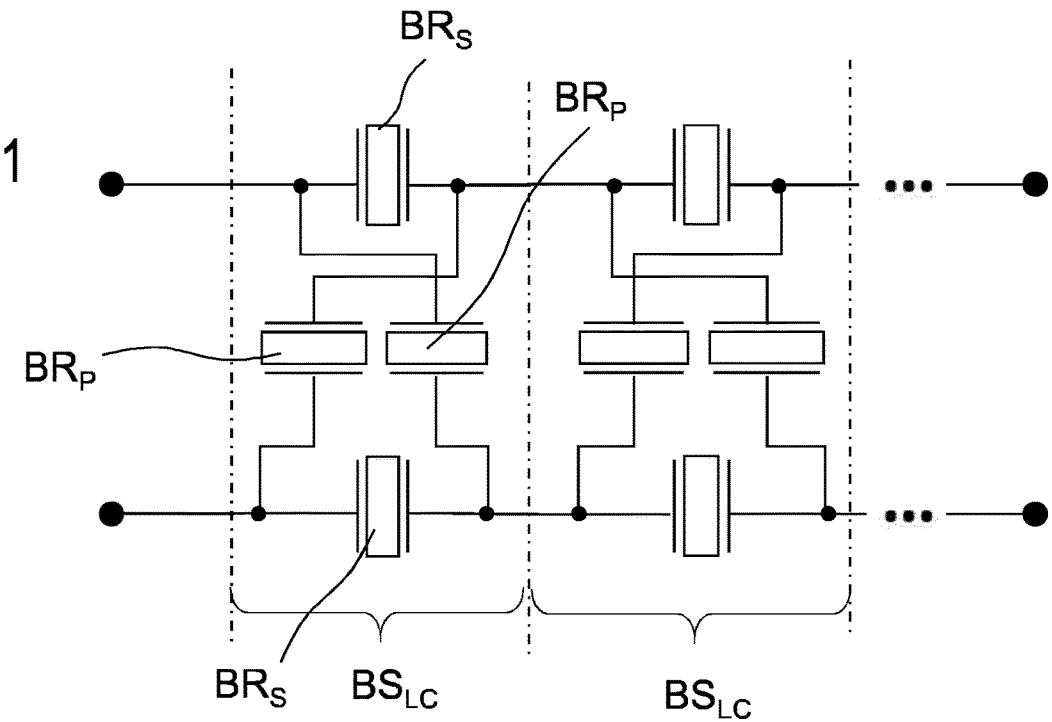

FIG. 1 shows a cross-sectional view through an SMR type BAW resonator with outer flaps and two enlarged sections, FIG. 2 shows a cross-sectional view through another SMR type BAW resonator having a modified acoustic mirror, FIG. 3 shows a more detailed cross-sectional view through the margin region of the BAW resonator, FIG. 4 shows a more detailed cross-sectional view through a modified margin region of the BAW resonator, FIG. 5 shows a cross-sectional view through a BAW resonator of the FBAR type, FIG. 6 shows a cross-sectional view through a modified margin region of the BAW resonator, FIG. 7 shows a cross-sectional view through another modified margin region of the BAW resonator, FIG. 8 shows a cross-sectional view through still another modified margin region of the BAW resonator, FIG. 9 shows a simplified block diagram of a ladder type filter circuit that may use the BAW resonator, FIG. 10 shows a simplified block diagram of a hybrid ladder type filter circuit that may use the BAW resonator as well as resonators made of passive element, FIG. 11 shows a simplified block diagram of a lattice filter circuit that may use the BAW resonator.

FIG. 1 shows a schematic cross-section through the BAW resonator. A stack is formed by layer sequence on a substrate SU of e.g. Si. Any other suitable rigid material can be used too. On top of the Si body a layer of $SiO_2$ may be formed for isolation purpose.

Next, an acoustic Bragg mirror is formed and structured on the substrate SU comprising two mirrors M1, M2 that is from two pairs of mirror layers. In the Bragg mirror, high impedance layer HI and low impedance layers LI are alternating. The mirror layers may slightly vary in thickness to set a desired reflection band. High impedance layer HI may comprise W and low impedance layers LI comprise $SiO_2$. Additional thin adhesion or orientation-promoting layers may be deposited below the mirror pair, e.g. Ti or AlN.

Optionally CMP planarization of the topmost mirror layer of $SiO_2$ can be employed for the mirror layers and or the later bottom electrode layers.

Next the bottom electrode BE is formed using a highly conductive AlCu layer and a high impedance W layer. Again a thin adhesion or orientation-promoting layer may be employed between the bottom electrode and uppermost mirror, e.g. Ti or AlN. Also a capping and/or etch-stop layer such as TiN may be applied to the top of the AlCu layer to allow patterning of additional resonator detuning material located between the Tungsten and AlCu layer of the bottom electrode.

Atop the bottom electrode W a piezoelectric layer PL of e.g. AlN or AlScN is formed. The thickness thereof is set to lower than half the wavelength of the desired resonance frequency due the additional mass loading effect from being attached to the top/bottom electrodes and mirror.

All the above layers in the stack are continuous layers extending at least over the later active resonator area.

On top of the piezoelectric layer PL a step forming material structure SM of e.g. $SiO_2$ or of $SiO_2$ and W is arranged that surrounds the active resonator region AR of the resonator. This step forming material SM may be applied just between the tungsten layer of the top electrode TE and the piezoelectric layer PL. A position of the step forming material SM between any other two layers or above the top layer is possible too.

On top of the already described arrangement and above the step forming material structure SM a stack of layers form the top electrode TE and the top passivating dielectric layer DL, e.g. made of SiN. Starting on the surface of the piezoelectric layer PL a thin adhesive Ti layer, a tungsten layer, an AlCu layer, a thin TiN layer and a dielectric layer of e.g. SiN are deposited. The SiN layer provides device passivation and serves as frequency fine-tuning trimming layer.

The two enlarged cross sections at the bottom of the figure show a more detailed structure of the step forming material. The section shown of the left bottom side of FIG. 1 shows an embodiment wherein the step-forming material SM of low acoustic impedance is arranged between the bottom layer of the top electrode made of W/AlCu and the piezoelectric layer PL. Above the step formed by the step-forming material SM the top electrode or its top sub-layer forms the outer flap OF.

The section shown of the right bottom side of FIG. 1 shows an embodiment wherein the step-forming material SM of low acoustic impedance is arranged between the bottom layer of the top electrode made of W and the AlCu top layer of the top electrode TE.

FIG. 2 shows a cross-section through a BAW resonator comprising an acoustic mirror of a high quality low impedance layer HQLI and optionally a high impedance layer HQHI. These two layers form a third mirror M3 deposited above the second mirror M2 of FIG. 1 and just below the bottom electrode. Thickness of the layers of the third mirror M3 are set as usual in view of a desired reflection band. However, deposition process is controlled to allow growth of polycrystalline mirror layers having improved acoustic impedance and quality.

For the deposition, a CVD, a PECVD or a sputter method may be used. Preferably the condition are set and controlled to achieve a slow and homogeneous crystal growing. Other process parameters too like temperature, gas flow, pressure or BIAS voltage are carefully controlled to support a regular orientation and the formation of large grains within the polycrystalline layers.

FIG. 3 shows a cross section through a margin region of the BAW resonator with further optional design features. The outer flap is embodied as shown in the right enlarged section of FIG. 1. When starting at the active resonator region AR and going towards the margin an underlap region is formed adjacent to the active resonator region AR. Here, the thickness of top electrode is reduced w.r.t. to the active region. In the overlap region OL adjacent to the underlap region UL a second step forming material of e.g. W is arranged under the top electrode TE above the piezoelectric layer PL. In the overlap region OL the total thickness of the layers above the piezoelectric layer is higher than in regions located more inwardly.

Adjacent to the overlap region OL the first step-forming material SM is arranged to provide the highest height level for the top electrode that forms the outer flap OF above the frame-shaped structure of the first step-forming material SM.

FIG. 4 shows cross section through a margin region of another BAW resonator showing the same further optional design features like the embodiment of FIG. 3 but having an inverted order of first step-forming material SM relative to the sub-layers of the top electrode TE. The arrangement accords in this detail with the bottom left cross-section of FIG. 1. This arrangement is believed to be the better choice in terms of performance of the BAW resonator.

FIG. 5 shows cross section through a BAW resonator of the FBAR type. Here, the layer sequence starting from bottom electrode BE is arranged above a recess RC in the substrate SU. At least below the active resonator region an air-filled cavity provides acoustic reflection due to the high impedance step at the interface to the bottom electrode. All other features and optional features may be embodied as described together with the FIGS. 1 to 4.

FIG. 6 shows details of a margin at the outer edge of the outer flap OF. The dielectric layer DL of SiN covers the edge and the adjacent surface of the piezoelectric layer PL. Here, the underlap is shown to be patterned in SiN rather than the top electrode layer as shown in FIGS. 3 and 4.

FIG. 7 shows the dame detail at the outer edge of the BAW resonator. W.r.t. FIG. 6 the sequence of step-forming material SM and bottom sub-layer of top electrode is interchanged. In both FIGS. 6 and 7 the TiN layer below the SiN layer covers only the top surface of the top electrode TE but not the edge.

FIG. 8 shows a cross-section through a BAW resonator that has the same layer sequence like the resonator of FIG. 6. However, at the outer edge a trench is structured through the dielectric layer DL to expose a stripe of the top surface of the piezoelectric layer as well as the edge of the top electrode. When the trench is properly dimensioned w.r.t. the top-electrode termination/edge a portion of any leaking lateral energy is reflected. The reflected wave improves the acoustic properties and avoids losses if the reflected energy is in phase but is destructive if it is out of phase. The phase thereof can be controlled by positioning suitable offset of trench w.r.t. the edge.

In the trench the capping dielectric DL of SiN is removed from the side-wall of the structure allowing the outer flap to be 'more free' as the SiN is relatively stiff. This applies less force to where the SiN comes into contact with the piezoelectric and reduces lateral energy leakage/excitation. All these materials can be etched together at once in one step (e.g. the layers of SiN, TiN, AlCu, W, SiO2 and Ti).

FIGS. 9 to 11 show schematic block diagrams of filter circuits comprising resonators that are circuited to form RF filters. BAW resonators as described above may advantageously be used in these filter circuits.

FIG. 9 shows a ladder-type arrangement comprising series BAW resonators $SR_S$ and parallel BAW resonators $BR_P$ that may be formed according to the invention with high quality mirror layers. In this embodiment a respective series BAW resonator $BR_S$ and an according parallel BAW resonator $BR_P$ form a basic section $BS_{LT}$ of the ladder-type arrangement. A ladder-type arrangement comprises a number of basic sections $BS_{LT}$ that can be circuited in series to achieve a desired filter function.

FIG. 10 shows a block diagram of a hybrid filter that is depicted with a minimum number of elements. A real circuit may comprise a higher number of such structures. In FIG. 5 a first partial circuit PC1 of the hybrid filter comprises a series impedance element $IE_S$ and a parallel impedance element $IE_P$. The series impedance element $IE_S$ can be embodied as a capacitor and the parallel impedance elements $IE_P$ can be embodied as a coil. A second partial circuit PC2 comprises at least one series BAW resonator $BR_S$ and at least one parallel BAW resonator $BR_P$. Within the combined filter circuit first and second partial circuits PC1, PC2, as shown in FIGS. 4 and 6, can alternate or be arranged in an arbitrary sequence.

The exact design of such a hybrid filter can be optimized according to the requirements of the desired hybrid filter. Such an optimization can easily be done by a skilled worker by means of an optimizing computer program.

FIG. 11 shows a lattice-type arrangement of BAW resonators comprising series and parallel BAW resonators. In contrast to the ladder-type arrangement, the parallel BAW resonators $BR_P$ are arranged in parallel branches that interconnect two series signal lines with series BAW resonators $BR_S$. The parallel branches are circuited in a crossover arrangement such that the basic section of the lattice-type arrangement $BS_{LC}$ comprises a first and a second series BAW resonator $SR_S$ arranged in two different signal lines and two parallel branches circuited to mutually cross over with a respective parallel BAW resonator $SR_P$ arranged therein. A lattice-type filter may comprise a higher number of basic sections according to the filter requirements.

Two or more of the filter circuits as shown in FIGS. 9 to 11 may form combined filters like duplexers or multiplexers. The filters may be used in RF circuits as band pass, notch or edge filters. The filter circuits may be combined with other circuit elements not shown or mentioned but generally known from the art.

The invention has been explained by a limited number of examples only and is thus not restricted to these examples. The invention is defined by the scope of the claims and may deviate from the provided embodiments.

LIST OF REFERENCE SYMBOLS AND USED TERMS

| | |
|---|---|
| BE | bottom electrode |
| PL | piezoelectric layer |
| TE | top electrode |
| AR | active resonator region |
| OL | overlap region |
| UL | underlap |
| OF | outer flap |
| DL | dielectric layer, comprising a |
| SiN | SiN layer |
| BE | bottom layer of top electrode comprising tungsten |
| AlCu | top layer of top electrode comprising AlCu |
| SM | intermediate step forming material |
| RC | recess in substrate below active resonator region |
| M1, M2 | acoustic mirrors |
| SU | substrate |
| HI | high impedance layer of M |
| LI | low impedance layer of M |
| HQLI | high quality low impedance layer |
| HQHI | high quality high impedance layer |

The invention claimed is:

1. A bulk acoustic wave (BAW) resonator, comprising:
a bottom electrode;
a piezoelectric layer disposed on the bottom electrode;
a step-forming material structure disposed over a portion of the piezoelectric layer; and
a top electrode disposed over the piezoelectric layer and the step-forming material structure;
wherein an active resonator region is formed where all three layers of the bottom electrode, the piezoelectric layer, and the top electrode overlap each other;
wherein the top electrode forms an outer flap at a higher level than level at a center of the active resonator region, with the outer flap extending away from the active resonator region;
wherein the higher level is formed over the step-forming material structure; and
wherein a first thickness of the top electrode between the outer flap and the active resonator region is less than a second thickness of the top electrode within the active resonator region.

2. The BAW resonator of claim 1, wherein a margin of the active resonator region comprises an overlap region outwardly adjacent to an underlap region comprising the first thickness of the top electrode.

3. The BAW resonator of claim 1, wherein the outer flap extends along a whole perimeter of the active resonator region thereby surrounding the active resonator region.

4. The BAW resonator of claim 1, wherein a dielectric layer comprising at least a SiN layer covers the top electrode.

5. The BAW resonator of claim 1, further comprising a dielectric layer disposed over the top electrode;
wherein an underlap region is formed at a margin of the active resonator region;
wherein the underlap region that extends along a whole perimeter between the active resonator region and an overlap region at the margin of the active resonator region; and
wherein in the underlap region, a total thickness of the top electrode and the dielectric layer is smaller than a respective total thickness of a substrate, the bottom electrode, and the piezoelectric layer in the center of the active resonator region.

6. The BAW resonator of claim 5, wherein the dielectric layer comprises a reduced thickness in the underlap region.

7. The BAW resonator of claim 6, wherein the reduced thickness of the dielectric layer in the underlap region is achieved by enhancing a dielectric layer height in the active resonator region by an additional layer of dielectric material to a portion of the dielectric layer covering the top electrode at the active resonator region exclusively in an area enclosed by the underlap region.

8. The BAW resonator of claim 6, wherein the total thickness of the top electrode and the dielectric layer being smaller than the respective total thickness is achieved by a reduced thickness of the top electrode.

9. The BAW resonator of claim 1, wherein the top electrode comprises AlCu; and
wherein the step-forming material structure is arranged between the top electrode and a layer comprising Pt or Ta.

10. The BAW resonator of claim 1, further comprising: a layer comprising at least one of W, Pt, Mo, and Ta;
wherein the step-forming material structure is arranged under the outer flap between the piezoelectric layer and the layer.

11. The BAW resonator of claim 10, wherein a thickness of the layer in an overlap region is higher than a thickness of the layer in an underlap region and in the active resonator region.

12. The BAW resonator of claim 1, wherein the piezoelectric layer comprises AlN doped with Sc.

13. The BAW resonator of claim 1, further comprising:
a substrate; and
a Bragg mirror disposed between the substrate and the bottom electrode and arranged below the active resonator region.

14. The BAW resonator of claim 1, wherein the step-forming material structure comprises a structured layer having an acoustic impedance lower than an acoustic impedance of the top electrode and the piezoelectric layer.

15. The BAW resonator of claim 14, wherein the step-forming material structure comprises a second layer formed on the structured layer having a high acoustic impedance relative to the acoustic impedance of the top electrode and the piezoelectric layer.

16. The BAW resonator of claim 15, wherein the second layer comprises at least one of Pt, Ta, or an alloy of Pt, or Ta.

17. The BAW resonator of claim 14, wherein the step-forming material structure comprises a second layer formed under the structured layer having a high acoustic impedance relative to the acoustic impedance of the top electrode and the piezoelectric layer.

* * * * *